(12) United States Patent
Liu et al.

(10) Patent No.: US 11,776,887 B2
(45) Date of Patent: Oct. 3, 2023

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Wei-Wei Liu, Kaohsiung (TW); Huei-Siang Wong, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 120 days.

(21) Appl. No.: 17/315,064

(22) Filed: May 7, 2021

(65) Prior Publication Data

US 2022/0359362 A1   Nov. 10, 2022

(51) Int. Cl.
*H01L 23/495* (2006.01)
*H01L 23/498* (2006.01)
*H01L 21/48* (2006.01)

(52) U.S. Cl.
CPC .... *H01L 23/49838* (2013.01); *H01L 21/4814* (2013.01); *H01L 23/49827* (2013.01)

(58) Field of Classification Search
CPC combination set(s) only.
See application file for complete search history.

(56) References Cited

U.S. PATENT DOCUMENTS

| | | | |
|---|---|---|---|
| 7,786,541 B2 * | 8/2010 | Izuo | G01L 9/0054 257/419 |
| 9,960,081 B1 | 5/2018 | Stevens et al. | |
| 2002/0180027 A1 * | 12/2002 | Yamaguchi | H05K 1/0271 257/772 |

* cited by examiner

*Primary Examiner* — Niki H Nguyen
(74) *Attorney, Agent, or Firm* — FOLEY & LARDNER LLP

(57) ABSTRACT

The present disclosure provides a semiconductor package structure and a method of manufacturing the same. The semiconductor package structure includes a semiconductor structure, a conductive trace and a tenting structure. The semiconductor structure has a first surface, a second surface and a third surface extending between the first surface and the second surface, and the first surface, the second surface and the third surface define a through-silicon via recessed from the first surface. The conductive trace is disposed adjacent to the first surface, the second surface and the third surface of the semiconductor structure. The tenting structure covering the TSV of the semiconductor structure. A cavity is defined by the tenting structure and the TSV.

9 Claims, 16 Drawing Sheets

SEMICONDUCTOR PACKAGE STRUCTURE AND METHOD FOR MANUFACTURING THE SAME

BACKGROUND

1. Field of the Disclosure

The present disclosure relates to semiconductor package structures and methods of manufacturing the same.

2. Description of Related Art

Through-Silicon Via (TSV) technique has been widely used to replace wire bonding. After the TSV is formed, an electroplating metal layer can be formed to fill the TSV. Due to the difference in CTE between materials, increased thermal stress can occur between, for example, the electroplating metal layer and the silicon substrate, decreasing the reliability of the semiconductor package structure. Therefore, a new semiconductor package structure is required.

SUMMARY

According to some embodiments of the present disclosure, a semiconductor package structure includes a semiconductor structure, a conductive trace and a tenting structure. The semiconductor structure has a first surface, a second surface and a third surface extending between the first surface and the second surface, and the first surface, the second surface and the third surface define a through-silicon via recessed from the first surface. The conductive trace is disposed adjacent to the first surface, the second surface and the third surface of the semiconductor structure. The tenting structure covering the TSV of the semiconductor structure, wherein a cavity is defined by the tenting structure and the TSV.

According to some embodiments of the present disclosure, a semiconductor package structure includes a semiconductor structure, a conductive terminal and a tenting structure. The semiconductor structure has a first top surface, a second top surface and a lateral surface extending between the first top surface and the second top surface. The semiconductor structure includes an active element and a conductive trace. The active element is embedded in the semiconductor structure. The conductive trace is disposed adjacent to the first top surface, the second top surface and the lateral surface of the semiconductor structure and electrically connected to the active element. The conductive terminal is disposed on the first top surface of the semiconductor structure and electrically connected to the active element through the conductive trace. The tenting structure is disposed on the first top surface of the semiconductor structure. A cavity is defined by the tenting structure, the first top surface and the lateral surface of the semiconductor structure.

According to some embodiments of the present disclosure, a method of manufacturing a semiconductor package structure includes: providing a semiconductor structure, the semiconductor structure having a first surface, a second surface and a third surface extending between the first surface and the second surface, and the first surface, the second surface and the third surface define a through-silicon via (TSV) recessed from the first surface, wherein the semiconductor structure includes a conductive trace disposed adjacent to first surface, the second surface and the third surface of the semiconductor structure; forming a tenting structure on the first surface of the semiconductor structure, wherein the tenting structure and the TSV define a cavity; and forming a conductive terminal on the first surface of the semiconductor structure, wherein the conductive terminal is electrically connected to the conductive trace.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1A:
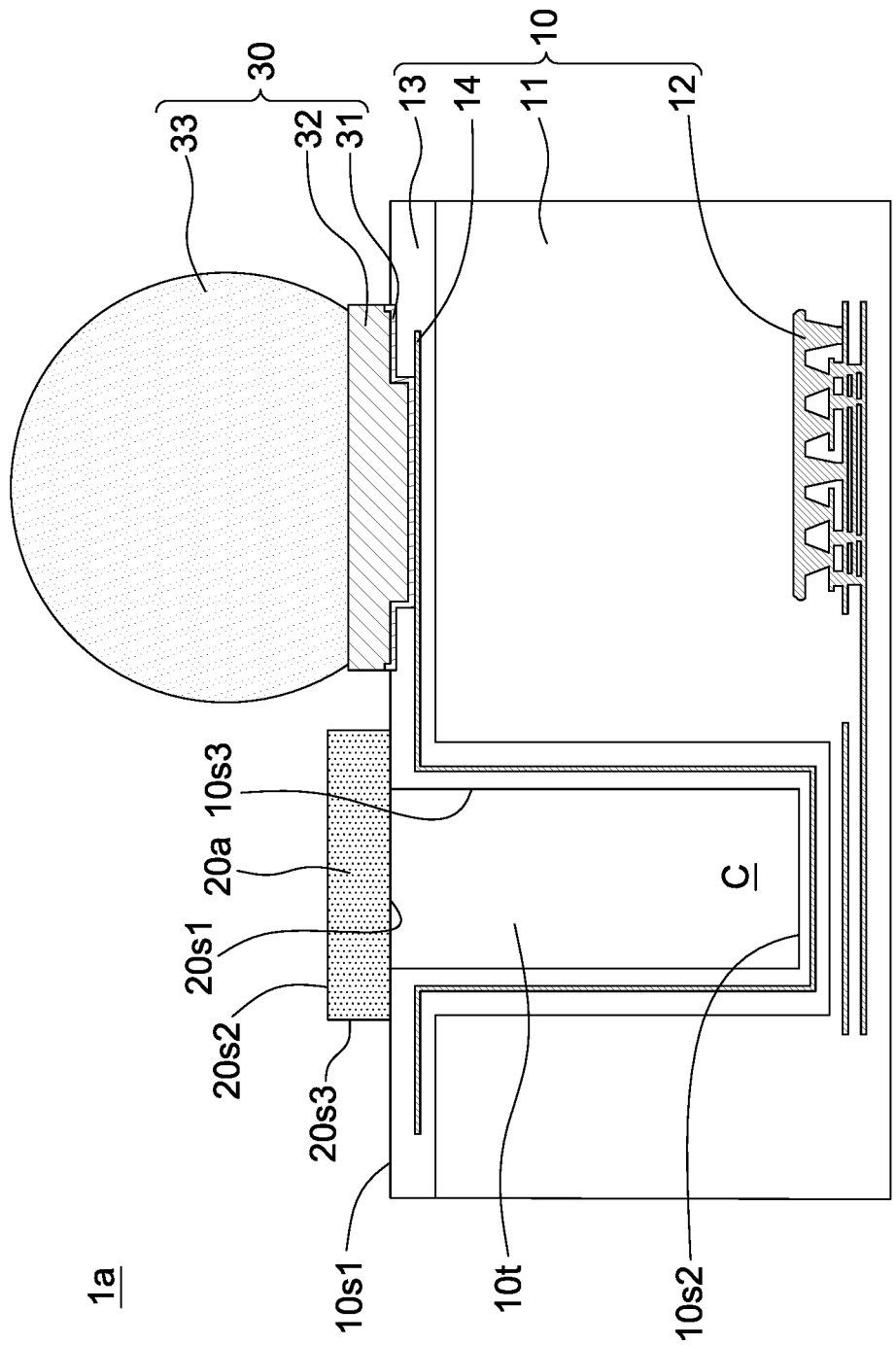
FIG. 1A is a cross-section of a semiconductor package structure according to some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-section of a semiconductor package structure 1a according to some embodiments of the present disclosure. In some embodiments, the semiconductor package structure 1a may include a semiconductor structure 10 and a tenting structure 20a.

The semiconductor structure 10 may have a surface 10s1 (or a top surface), a surface 10s2 (or a top surface) and a surface 10s3 (or a lateral surface). The surface 10s1 may be the outmost layer of the semiconductor structure 10. The surface 10s2 may be substantially parallel to the surface 10s1. The surface 10s2 may be recessed from the surface 10s1. The surface 10s2 may be located at an elevation lower than that of the surface 10s1. The surface 10s3 may extend between the surface 10s1 and the surface 10s2. The surface 10s3 may be substantially perpendicular to the surface 10s1 or the surface 10s2. In some embodiments, the surface 10s1, the surface 10s2 and the surface 10s3 may define a through-silicon via (TSV) 10t recessed from the surface 10s1, and the surface 10s2 may be defined as a bottom of the TSV 10t. In some embodiments, the TSV 10t may have an aspect ratio, for example, from about 1:1 to about 1:20, such as 1:2, 1:3; 1:5; 1:10 or 1:15. For example, the ratio between the width (or diameter) of the surface 10s2 and the depth (or length) of the surface 10s3 of the semiconductor structure 10 may range from about 1:1 to about 1:20, such as 1:2, 1:3; 1:5; 1:10 or 1:15.

In some embodiments, the semiconductor structure 10 may include a substrate 11, active element(s) 12, a dielectric structure 13, and conductive trace(s) 14. In order to concisely describe the embodiments of the present disclosure, some elements are omitted, and it is appreciated that the semiconductor structure 10 may include other elements, such as circuit(s), electronic component(s) including active component(s) and passive component(s), conductive element(s), non-conductive element(s) as well as other elements depending on the requirement of the semiconductor package structure 1a.

The substrate 11 may be a semiconductor substrate, such as a bulk semiconductor or other suitable substrates, a semiconductor-on-insulator (SOI) substrate, or the like. The substrate 11 may be a wafer, such as a silicon wafer. In some embodiments, the semiconductor material of the substrate 11 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 11 may define a TSV corresponding to the TSV 10t. That is, the substrate 11 may have surfaces (e.g., upper surface, lower surface and lateral surface) corresponding to the surface 10s1, surface 10s2 and surface 10s3, respectively.

The active element(s) 12 may be embedded in the substrate 11. The active element 12 may be included in an integrated circuit (IC) such as a microprocessor, memory device, and/or another IC. In some embodiments, the active element 12 may also include at least one active electronic component, such as metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. In some embodiments, the active element 12 may be an optical electronic component, such as a CMOS, which can serve as an optical sensor.

The dielectric structure 13 may be disposed on the substrate 11. In some embodiments, the dielectric structure 13 may be conformally disposed on the TSV of the substrate 11. That is, the dielectric structure 13 may be conformally disposed on and cover the lower surface, the lateral surface and the upper surface of the substrate 11. The dielectric structure 13 may cover the lower surface, the lateral surface and the upper surface of the TSV 10t. The dielectric structure 13 may include dielectric layer(s), such as silicon oxide, silicon nitride and/or other suitable dielectric layers. In this disclosure, the top surface of the dielectric structure 13 may be defined as the surface 10s1 of the semiconductor structure 10, the lower surface of the dielectric structure 13 may be defined as the surface 10s2 of the semiconductor structure 10, and the lateral surface of the dielectric structure 13 may be defines as the surface 10s3 of the semiconductor structure 10. The dielectric structure 13 may be substantially transparent such that the conductive trace 14 and/or the substrate 11 can be detected with an image sensor, such as a camera or other suitable sensor.

The conductive trace 14 may be embedded in the semiconductor structure 10. In some embodiments, the conductive trace 14 may be embedded in the dielectric structure 13. The conductive trace 14 may be partially disposed within the TSV 10t of the semiconductor structure 10. The conductive trace 14 may also be referred to as a liner because it is relatively thin, for example, from about 0.1 μm to about 10 μm, such as 0.3 μm, 0.5 μm, 1 μm, 3 μm, 5 μm, 7 μm or 9 μm. The conductive trace 14 may be disposed adjacent to the surface 10s1, the surface 10s2 and the surface 10s3 of the semiconductor structure 10. The conductive trace 14 may be conformally disposed on and cover the lower surface, the upper surface and the lateral surface of the substrate 11. The conductive trace 14 may include metal, metal alloy or other suitable materials. The conductive trace 14 may include, for example, copper, copper alloy, or other suitable materials. The conductive trace 14 may be electrically connected to the active element 12. In some embodiments, the conductive trace 14 may be electrically connected to the active element 12 through trace(s) and/or circuit(s) embedded in the substrate 11.

Since the sum of the thicknesses of the dielectric structure 13 and the conductive trace 14 is minimal, the TSV of the substrate 11 may also be defined as the TSV 10t of the semiconductor structure 10. In this condition, the upper surface of the substrate 11 may be defined as the surface 10s1 of the semiconductor structure 10, the lower surface of the substrate 11 may be defined as the surface 10s2 of the semiconductor structure 10, and the lateral surface of the substrate 11 may be defined as the surface 10s3 of the semiconductor structure 10.

The tenting structure 20a may have a surface 20s1, a surface 20s2, and a surface 20s3. The surface 20s1 may face the surface 10s2 of the semiconductor structure 10. The surface 20s2 may be opposite to the surface 20s1. The surface 20s3 may extend between the surface 20s1 and the surface 20s2. In some embodiments, the tenting structure 20a may cover the TSV 10t of the semiconductor structure 10. That is, the surface 10s1 of the semiconductor structure 10 may be covered by the tenting structure 20a. In some embodiments, the tenting structure 20a may cover and contact the surface 10s1 of the semiconductor structure 10. In some embodiments, the tenting structure 20a may be separated from the surface 10s2 of the semiconductor structure 10. In some embodiments, the tenting structure 20a is free from overlapping the active elements.

In some embodiments, the tenting structure 20a and the semiconductor structure 10 may collaboratively define a cavity C. The cavity C may be defined as a space enclosed by the surface 10s2, the surface 10s3 of the semiconductor structure 10 and the surface 20s1 of the tenting structure 20a. In some embodiments, the cavity C may be filled with air or gas. That is, the surface 10s2 of the semiconductor structure 10 may be exposed to air or gas, and the surface 10s3 of the semiconductor structure 10 may be exposed to air or gas. The surface 20s1 of the tenting structure 20 may be exposed to air or gas. The tenting structure 20a may be configured to protect the cavity C from being contaminated by external substance(s), such as chemical(s) or other. The tenting structure 20a may include dielectric material, which is flexible and/or transparent. The tenting structure 20a may be substantially transmissive to light, such as visible light, infrared light, or ultraviolet light. For example, the transmittance of the tenting structure 20a may be greater than or exceed 80%, such as 85%, 90%, 95%, 97% or 99% with respect to visible light, infrared light and/or ultraviolet light. The tenting structure 20a may include polymer, such as epoxy, polyimide, benzocyclobutene (BCB) or other suitable materials.

In some embodiments, the edge (e.g., the surface 20s3) of the tenting structure 20a may exceed the edge of the TSV 10t (e.g., the surface 10s3) of the semiconductor structure 10. For example, a distance between the surface 20s3 of the tenting structure 20a and the surface 10s3 of the semiconductor structure 10 may exceed or equal 1 such as 3 μm, 5 μm, 10 μm or more. The mismatch of alignment of the lithography tools may exceed or equal 1 μm due to the limit of the tools. Therefore, the distance between the surface 10s3 of the semiconductor structure 10 and the surface 20s3 of the tenting structure 20 exceeding or equal to 1 μm may prevent the patterned tenting structure 20 not completely covering the TSV 10t of the semiconductor structure 10. Further, when the distance between the surface 10s3 of the semiconductor structure 10 and the surface 20s3 of the tenting structure 20 exceeds or be greater than 1 it may ensure that the tenting structure 20a is strongly attached to the semiconductor structure 10 and prevent peeling thereof.

In some embodiments, the semiconductor package structure 1a may further include conductive terminal(s) 30. The conductive terminal(s) 30 may be disposed on the surface 10s1 of the semiconductor structure 10. In some embodiments, the conductive terminal 30 may be spaced apart from the tenting structure 20a. The conductive terminal 30 may be configured to electrically connect the semiconductor structure 10 and other electronic component(s) (not shown). The conductive terminal 30 may be electrically connected to the active element 12 through the conductive trace 14. The conductive terminal 30 may include a layer 31, a layer 32 and an electric connector 33.

The layer 31 may be disposed on the surface 10s1 of the semiconductor structure 10. The layer 31 may include a seed layer, such as tin, copper or other suitable materials. The layer 31 may be in contact with the conductive trace 14.

The layer 32 may be disposed on the layer 31. The layer 32 may serve as an under bump metallization (UBM) connecting the electric connector 33. The layer 32 may include conductive material, such as metal, metal alloy, or other.

The electric connector 33 may be disposed on the layer 32. The electric connector 33 may include, for example, a solder ball, which may include lead or may be lead free (e.g., including one or more materials such as alloys of gold and tin solder or alloys of silver and tin solder).

Figure 1B:
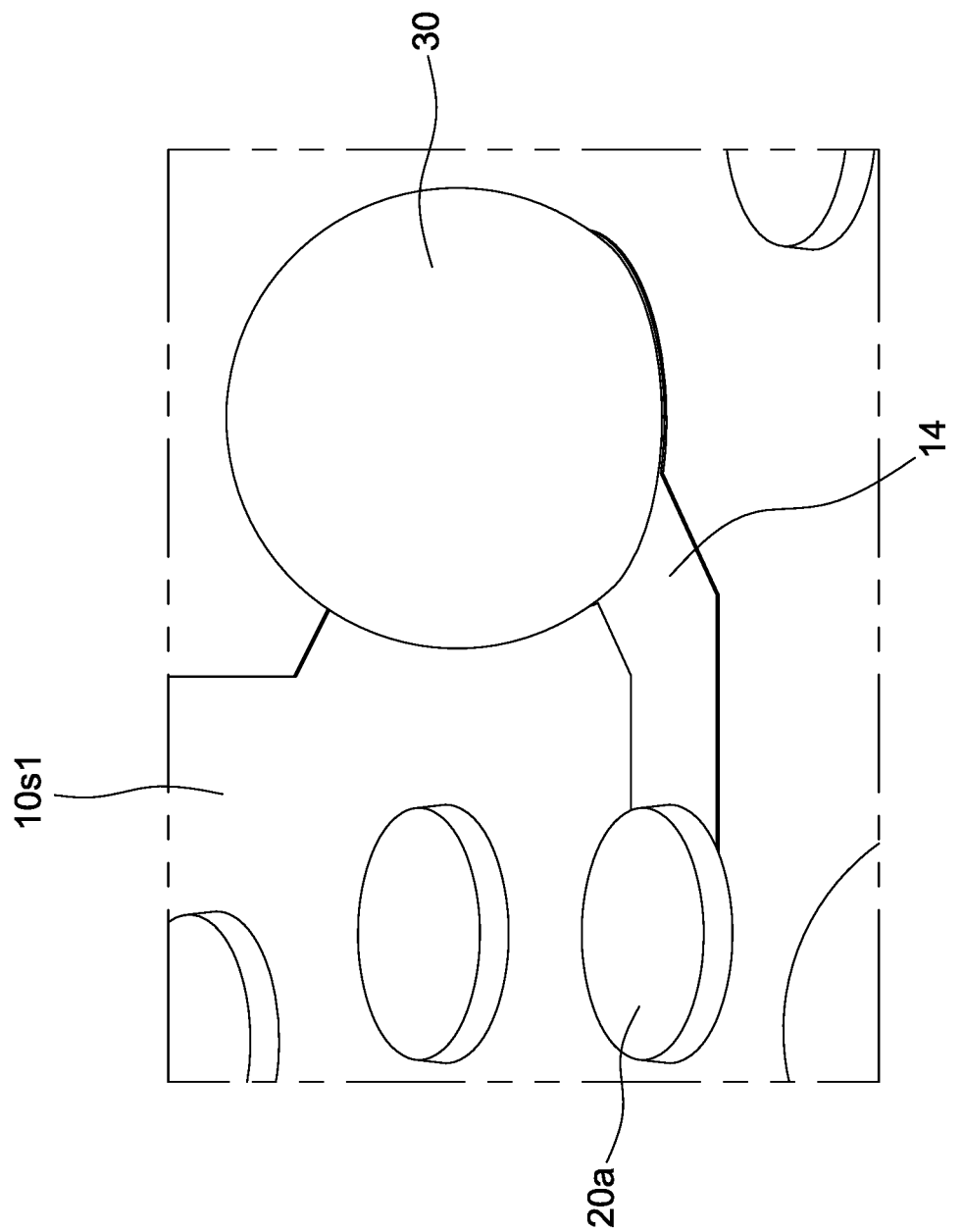
FIG. 1B is a top view of the semiconductor package structure of FIG. 1.

FIG. 1B is a top view of the semiconductor package structure 1a of FIG. 1. The tenting structure 20a may be spaced from the conductive terminal 30. The conductive trace 14 may extend from the tenting structure 20a to the conductive terminal 30. The tenting structure 20a may be, for example, circular, or have other suitable profile.

In some embodiments, the semiconductor package structure 1a may be applicable to product(s) of light communication and/or light detection, and the transparent tenting structure 20a may assist therein. For example, the cavity C may serve as a resonant cavity for light guidance. Further, when the cavity C is filled with air or gas, signal loss during the transmittance of light may be decreased.

In a comparative example, a conductive material, such as an electroplating metal layer, is filled in the TSV of the semiconductor package structure. Due to the difference of CTE between the electroplating metal layer and the substrate, increased thermal stress occurs therebetween, resulting in changes to the resistivity of the semiconductor package structure, such that reliability of the comparative semiconductor package structure is compromised. In the embodiments of the present disclosure, the structure of the conductive trace 14 within the TSV 10t replaces the electroplating metal layer, which may reduce thermal stress. In addition, compared to the electroplating metal layer, the formation of the conductive trace 14 may have a relatively less process time. As a result, the embodiments of the present disclosure may improve the efficiency of manufacturing a semiconductor package structure. Further, the tenting structure 20a protects the TSV 10t from damage from external substance(s), and the combination of the tenting structure 20a and the TSV 10t may be applicable to various product(s) related to light communication, light detection, or other applications.

Figure 2A:
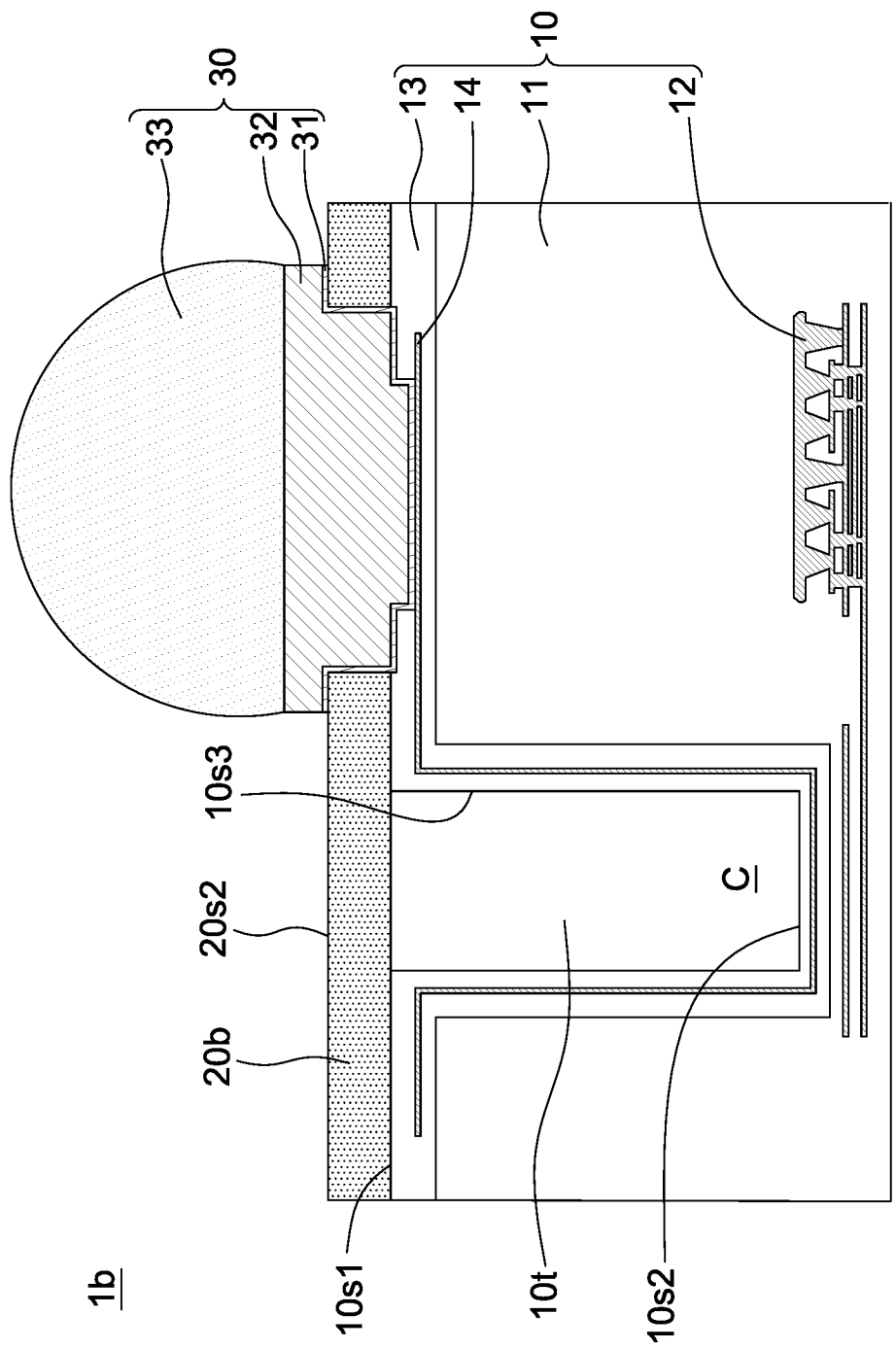
FIG. 2A is a cross-section of a semiconductor package structure according to some embodiments of the present disclosure.

FIG. 2A is a cross-section of a semiconductor package structure 1b according to some embodiments of the present disclosure. The semiconductor device package 1b of FIG. 2A has a structure similar to the semiconductor device package 1a of FIG. 1A, except for tenting structure 20b of the semiconductor device package 1b.

In some embodiments, the tenting structure 20b may be in contact with the conductive terminal 30. In some embodiments, the tenting structure 20b may define an opening accommodating the conductive terminal 30 such that the tenting structure 20b may be in contact with the sidewall of the conductive terminal 30. For example, the tenting structure 20b may be in contact with the sidewall of the layer 31. In some embodiments, the layer 31 may be disposed on the surface 20s2 of the tenting structure 20b.

Figure 2B:
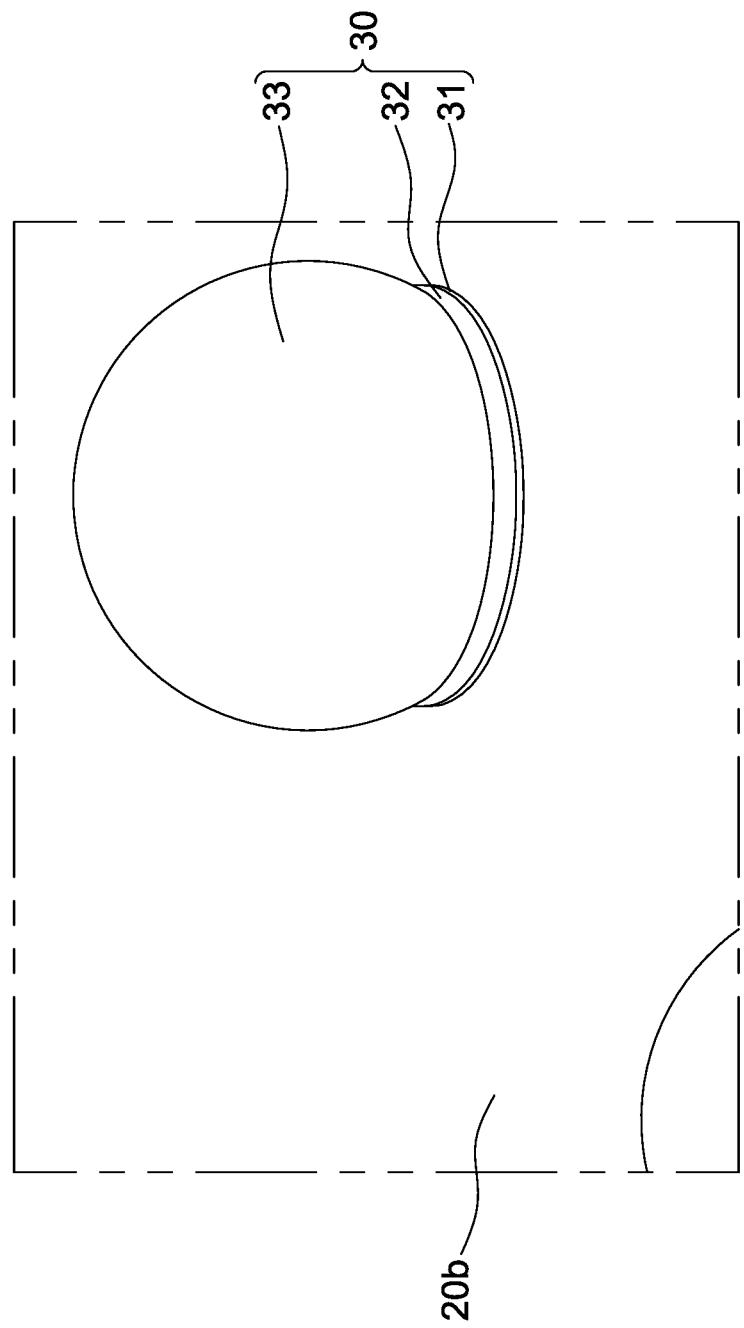
FIG. 2B is a top view of the semiconductor package structure of FIG. 1.

FIG. 2B is a top view of the semiconductor package structure 1b of FIG. 2. As shown in FIG. 2, the conductive trace 14 may be substantially completely covered by the tenting structure 20b and the conductive terminal 30. In some embodiments, the lateral surfaces of the layer 31 and the layer 32 may be exposed from the tenting structure 20b.

Figure 3:
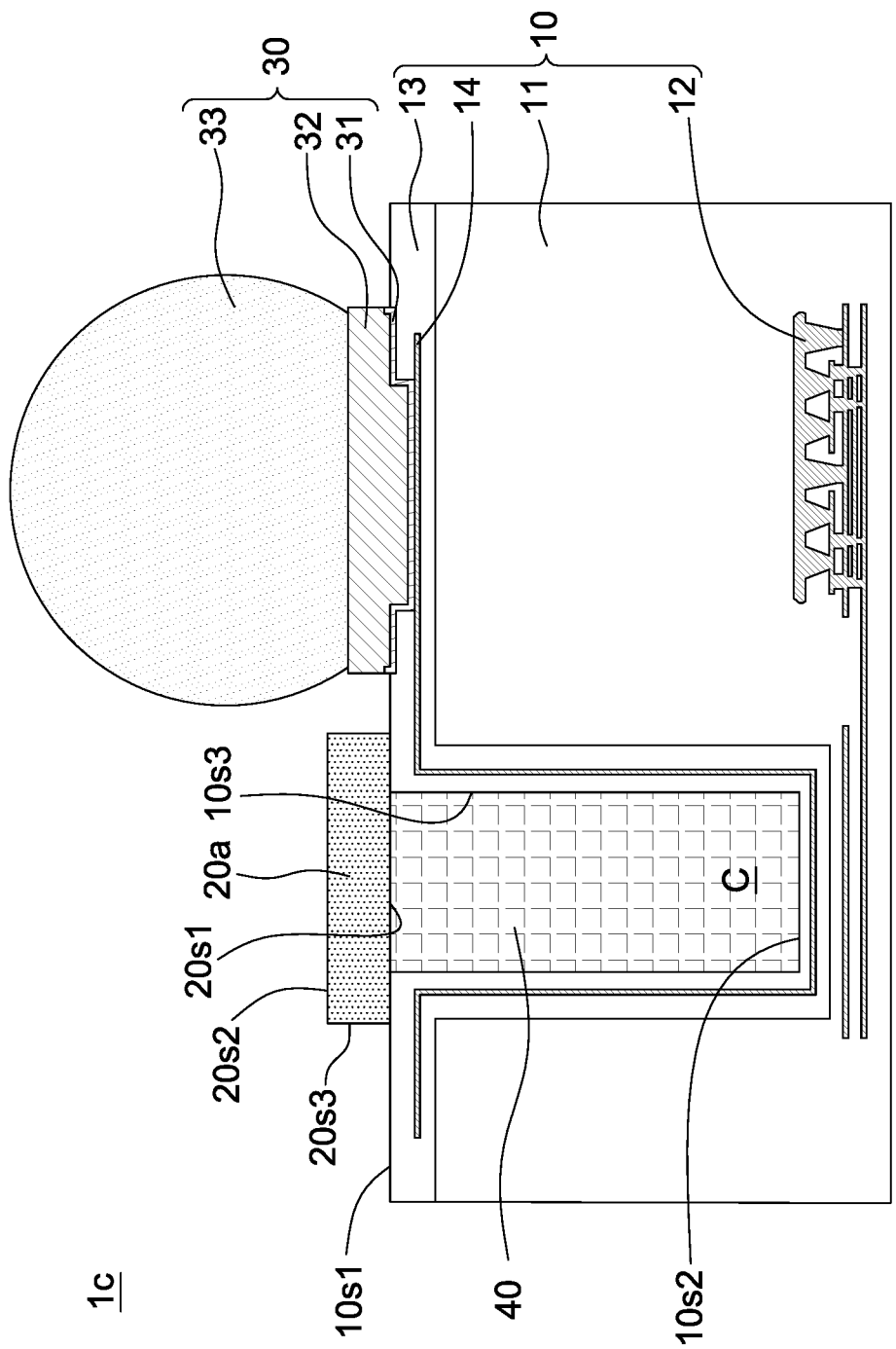
FIG. 3 is a cross-section of a semiconductor package structure according to some embodiments of the present disclosure.

FIG. 3 is a cross-section of a semiconductor package structure 1c according to some embodiments of the present disclosure. The semiconductor device package 1c of FIG. 3 has a structure similar to the semiconductor device package 1a of FIG. 1A, except for dielectric material 40 of the semiconductor device package 1c.

The dielectric material 40 may be disposed within the TSV 10t of the semiconductor structure 10. The dielectric material 40 may include transparent material(s). The dielectric material 40 may serve as a medium of light transmission.

In some embodiments, the dielectric material 40 may be in contact with the surface 20s1 of the tenting structure 20a. In another embodiment, the dielectric material 40 may be spaced apart from the surface 20s1 of the tenting structure 20a. That is, the cavity C may be partially filled with the dielectric material 40 and partially filled with air or gas.

Figure 4:
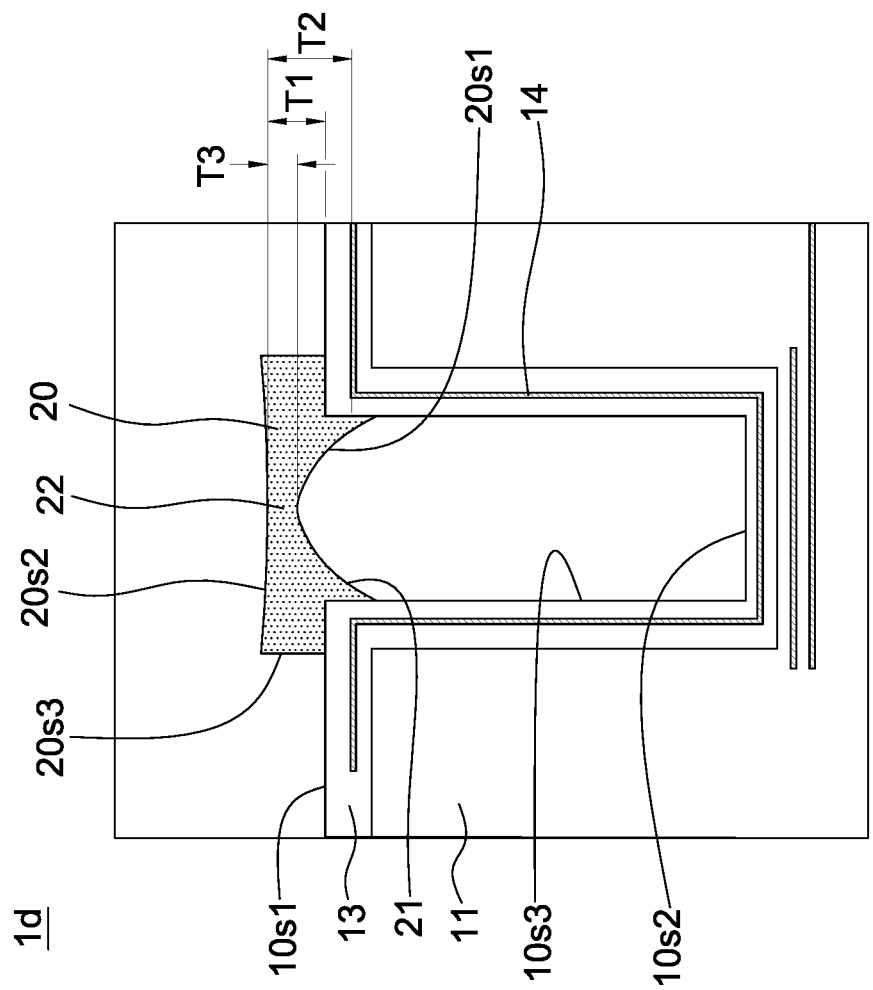
FIG. 4 is a cross-section of a semiconductor package structure according to some embodiments of the present disclosure.

FIG. 4 is a cross-section of a semiconductor package structure 1d according to some embodiments of the present disclosure.

The tenting structure 20 has a thickness T1 over the surface 10s1 of the semiconductor structure 10, a thickness T2 proximal to an edge of the cavity C or the TSV 10t (or proximal to the surface 10s3 of the semiconductor structure 10), and a thickness T3 over the surface 10s2 of the semiconductor structure 10 and apart from the edge of the cavity C or the TSV 10t. The thickness T2 of the tenting structure 20 may also be defined as a thickness at a relatively peripheral region of the TSV 10t, and the thickness T3 of the tenting structure 20 may also be defined as a thickness at a relatively central region of the TSV 10t. In some embodiments, the thickness T1 is less than the thickness of the T2. In some embodiments, the thickness T1 exceeds the thickness of the T3.

During the process of forming the tenting structure 20, a baking or heating technique may be performed, resulting in deformation of the tenting structure 20. As shown in FIG. 4, the surface 20s1 of the tenting structure 20 has a portion recessed with respect to the surface 10s1 of the semiconductor structure 10 and another portion protruding with respect to the surface 10s1 of the semiconductor structure 10. In some embodiments, the tenting structure 20 may have a tip portion 21 and an inwardly-recessed area 22 (or an inwardly-recessed surface). In some embodiments, the tip portion 21 may be located at a relatively peripheral region of the TSV 10t. The tip portion 21 may cover the corner, defined by the surface 10s1 and the surface 10s3, of the semiconductor structure 10. The tip portion 21 may cover the corner of the conductive trace 14, wherein the corner of the conductive trace 14 may be defined as a region proximal to the surface 10s1 and the surface 10s3 of the semiconductor structure 10. The tip portion 21 of the tenting structure 20 may be in contact with the surface 10s3 of the semiconductor structure 10. That is, the tip portion 21 of the tenting structure 20 may cover a portion of the surface 10s3 of the semiconductor structure 10. The inwardly-recessed area 22 of the tenting structure 20 may be recessed from the surface 20s1 of the tenting structure 20. In some embodiments, the inwardly-recessed area 22 of the surface 20s1 of the tenting structure 20 may substantially align with the opening of the TSV 10t. In some embodiments, the inwardly-recessed area 22 of the surface 20s1 of the tenting structure 20 may substantially align with the surface 10s2 of the semiconductor structure 10. In some embodiments, the surface 20s1 of the tenting structure 20 may form an arc or have an arc-shaped profile. In some embodiments, the surface 20s2 of the tenting structure 20 may have a concave profile. That is, the surface 20s2 may have an inwardly-recessed area.

FIG. 5A, FIG. 5B, FIG. 5C, FIG. 5D, FIG. 5E, and FIG. 5F illustrate various stages of a method for manufacturing a semiconductor package structure in accordance with some embodiments of the present disclosure.

Figure 5A:
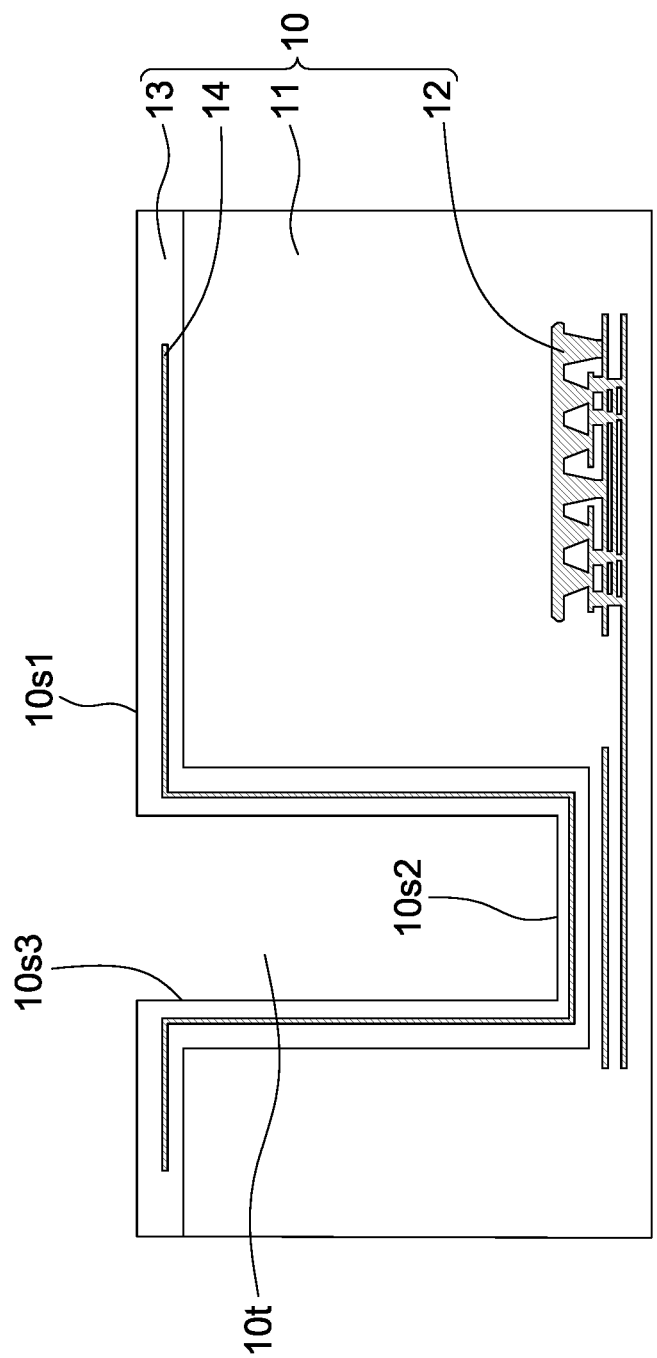
FIG. 5A, FIG. 5B, FIG. 5C, FIG. 5D, FIG. 5E, and FIG. 5F illustrate various stages of a method for manufacturing a semiconductor package structure in accordance with some embodiments of the present disclosure.

Referring to FIG. 5A, a semiconductor structure 10 may be provided. The semiconductor structure 10 may include a substrate 11, active element(s) 12, a dielectric structure 13 and conductive trace(s) 14. The semiconductor structure 10 may have a surface 10s1 (or a top surface), a surface 10s2 (or a top surface), and a surface 10s3 (or a lateral surface). The surface 10s1, the surface 10s2 and the surface 10s3 may define a TSV 10t recessed from the surface 10s1. The surface 10s2 may be defined as a bottom of the TSV 10t. The substrate 11 may define a TSV corresponding to the TSV 10t of the semiconductor structure 10. The active element 12 may be embedded in the substrate 11. The dielectric structure 13 may be conformally disposed on the TSV of the substrate 11. The conductive trace 14 may be embedded in the dielectric structure 13 and disposed adjacent to the surface 10s1, the surface 10s2, and the surface 10s3 of the semiconductor structure 10.

Figure 5B:
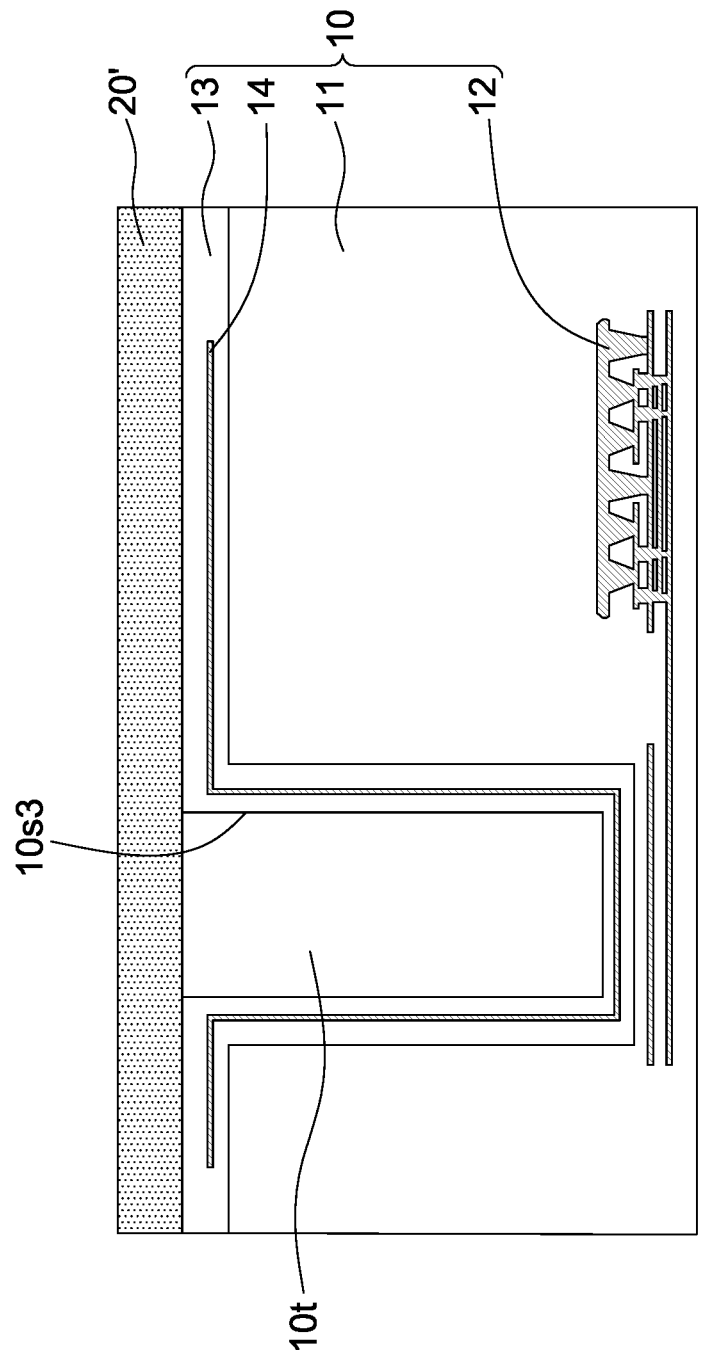

Referring to FIG. 5B, a dielectric film 20' may be formed on the surface 10s1 of the semiconductor structure 10 and cover the TSV 10t of the semiconductor structure 10. The dielectric film 20' may be not substantially fill in the TSV 10t of the semiconductor structure 10. For example, the dielectric film 20' may not be in contact with the surface 10s3 of the semiconductor structure 10. The dielectric film 20' may be formed on the semiconductor structure 10 by an attaching technique. The dielectric film 20' may include a polymer thin film.

Figure 5C:
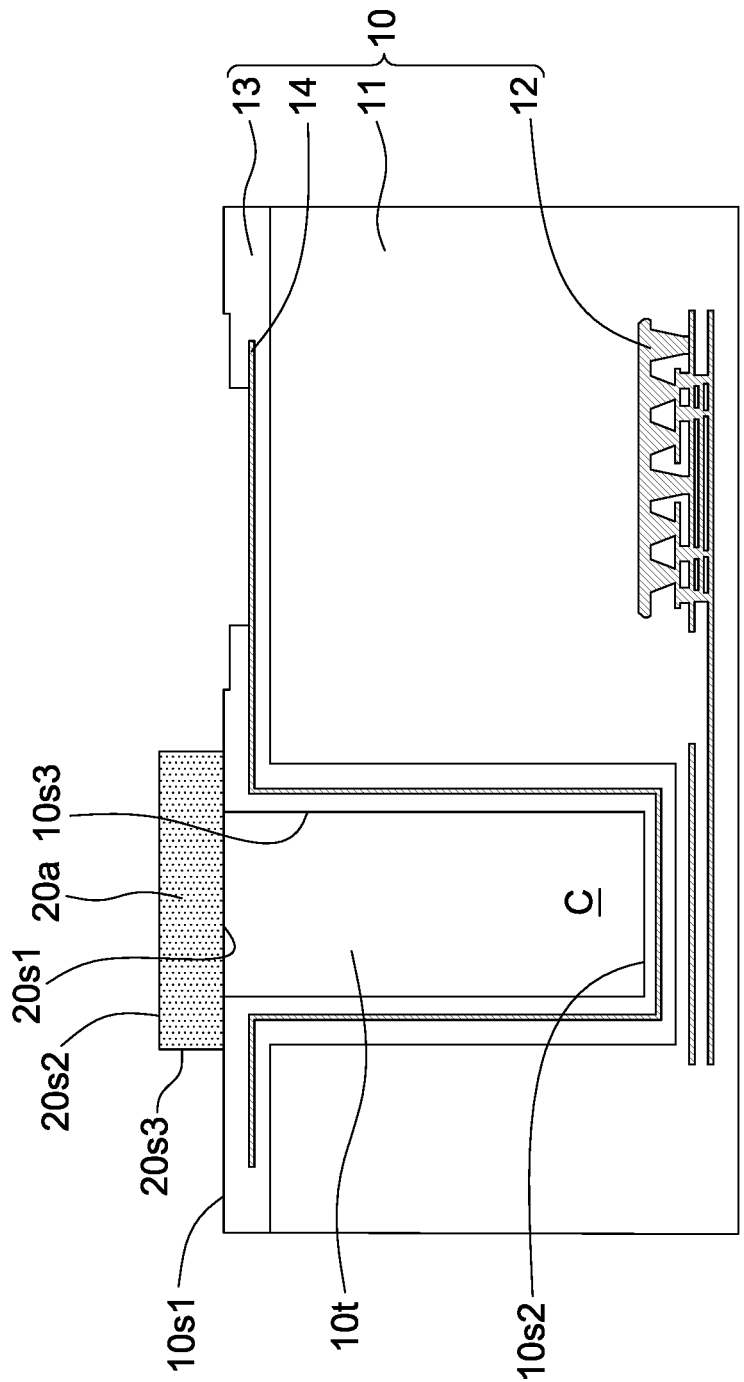

Referring to FIG. 5C, an etching technique may be performed to pattern the dielectric film 20' to form the tenting structure 20a. The tenting structure 20a may cover the TSV 10t of the semiconductor structure 10 and define a cavity C. A portion of the conductive trace 14 may be exposed by the tenting structure 20a. The etching technique may include a wet etching technique, a dry etching technique or other suitable techniques. The dielectric structure 13 may be patterned such that a recess may be formed and the conductive trace 14 may be exposed from the surface 10s1 of the semiconductor structure 10.

Figure 5D:
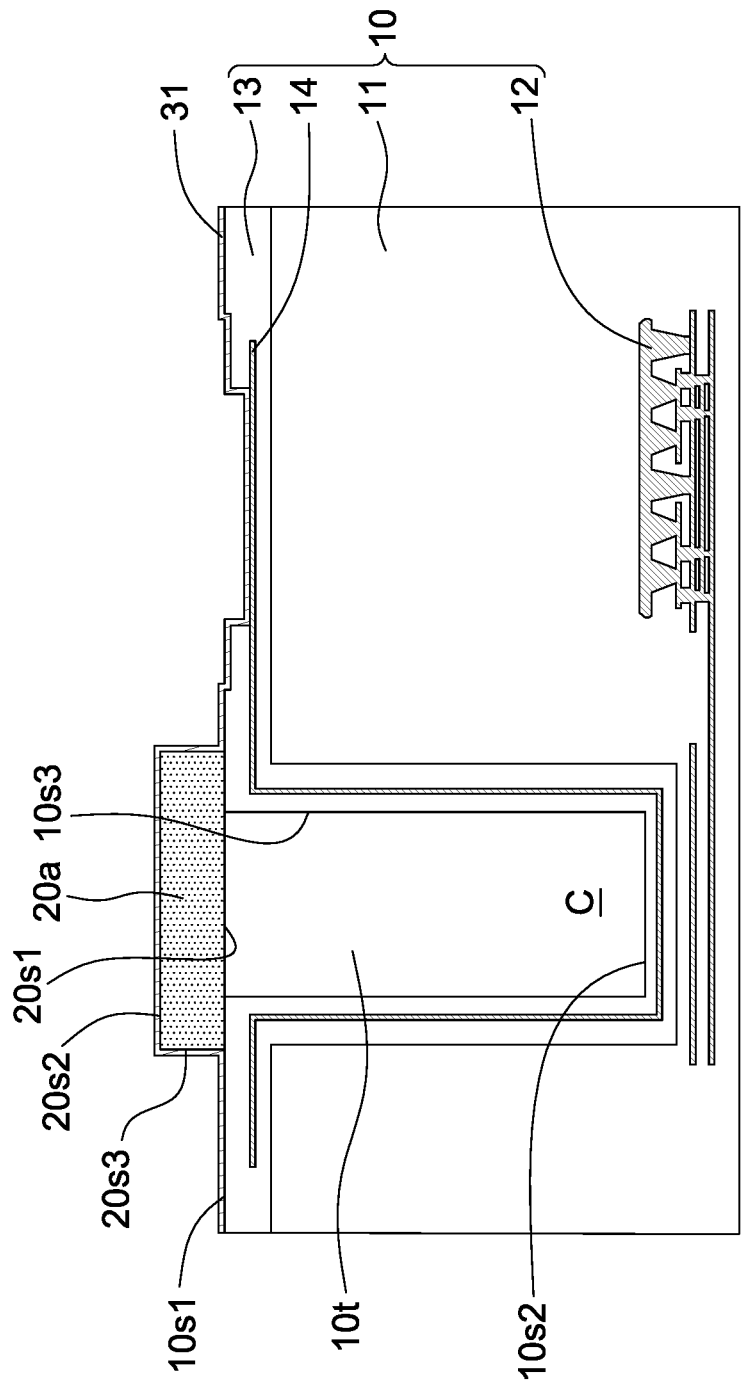

Referring to FIG. 5D, a layer 31 may be formed on the surface 10s1 of the semiconductor structure 10 and the tenting structure 20a. The layer 31 may be in contact with the conductive trace 14.

Figure 5E:
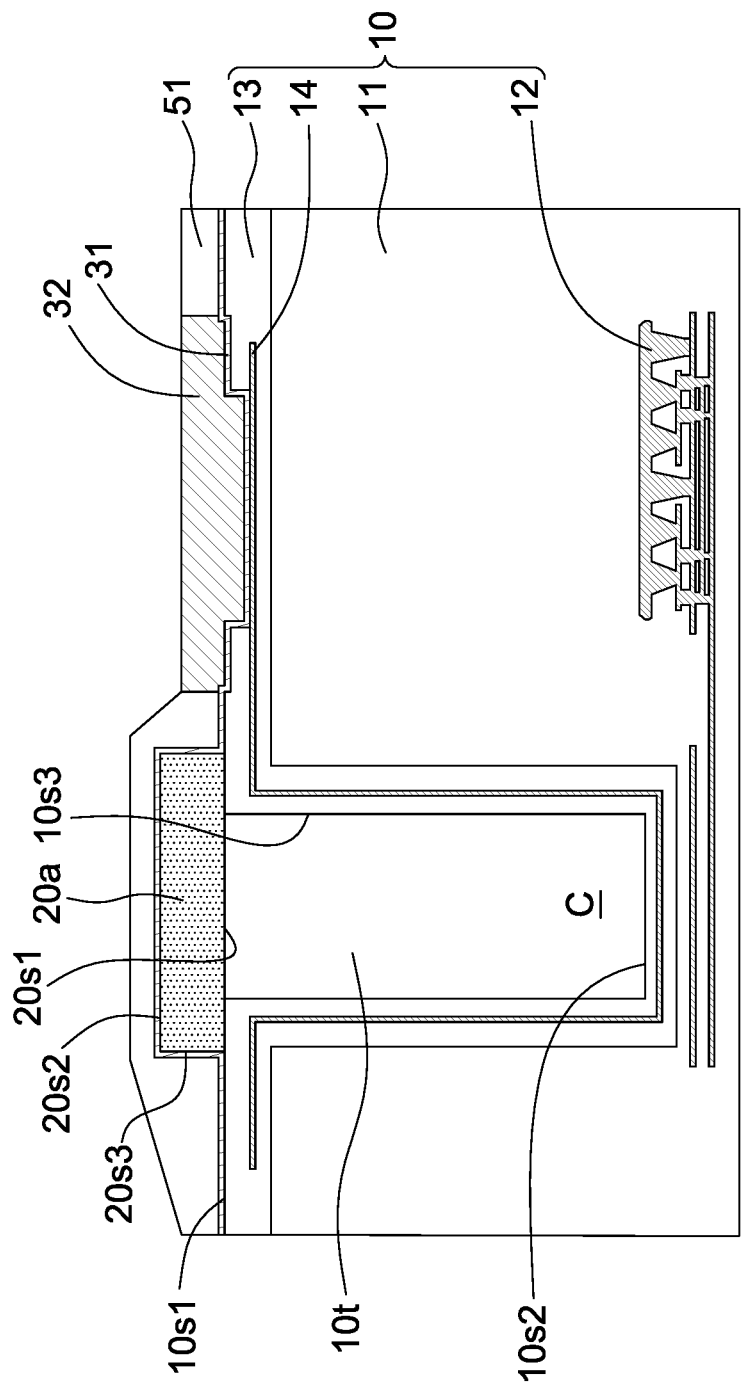

Referring to FIG. 5E, a photoresist layer 51 may be formed to cover the surface 10s1 of the semiconductor structure 10 and the tenting structure 20. The photoresist layer 51 may be configured to define a region for forming a conductive terminal 30. The photoresist layer 51 may be patterned to define an opening, and a layer 32 may be formed within the opening of the photoresist layer 51. The layer 32 may be formed by, for example, an electroplating technique.

Figure 5F:
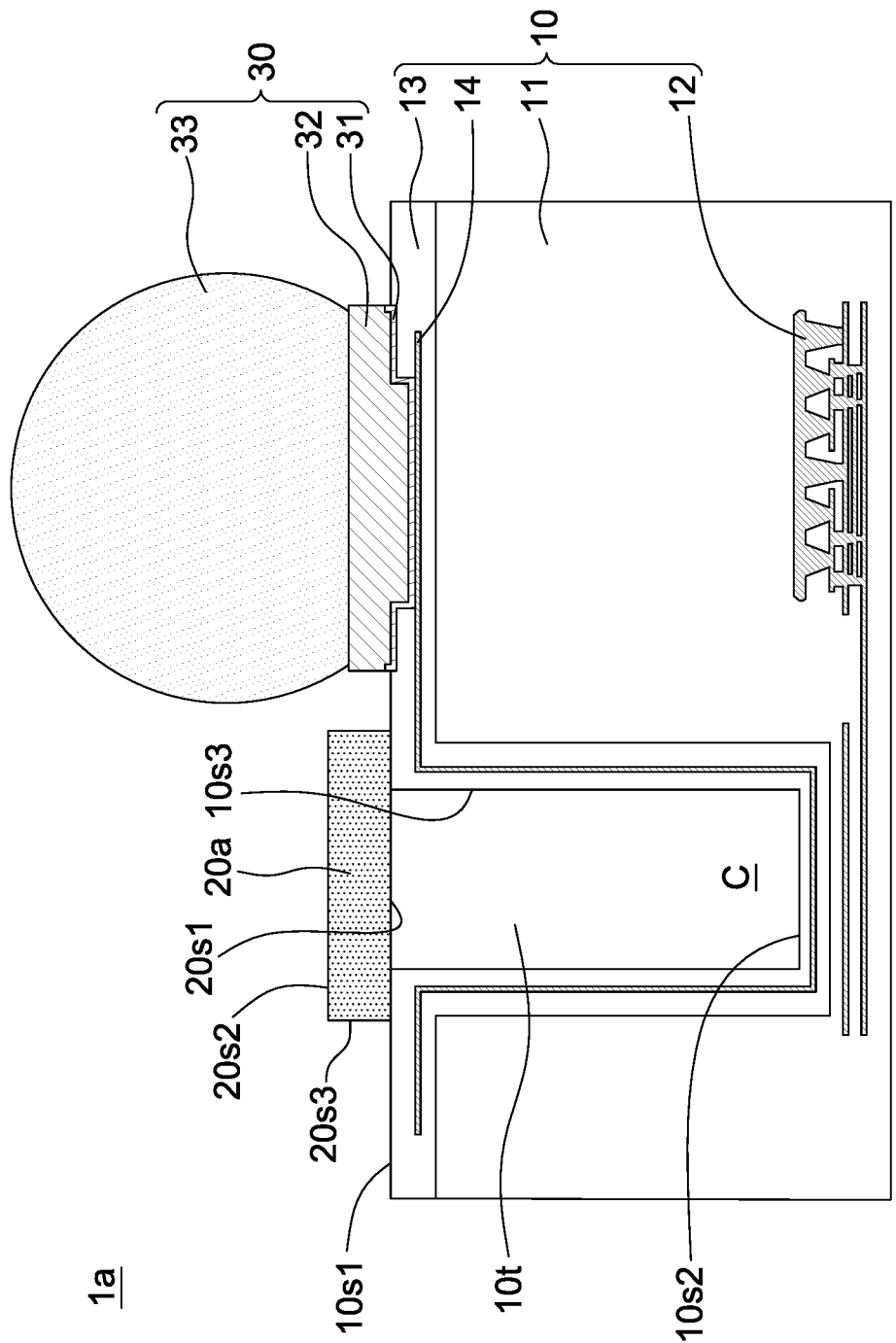

Referring to FIG. 5F, an electric connector 33 may be formed on the layer 32 to produce the conductive terminal 30. The photoresist layer 51 and the layer 31 underlying the photoresist layer 51 may be removed such that a semiconductor device structure the same as or similar to the semiconductor device structure 1a shown in FIG. 1A is produced.

Figure 6A:
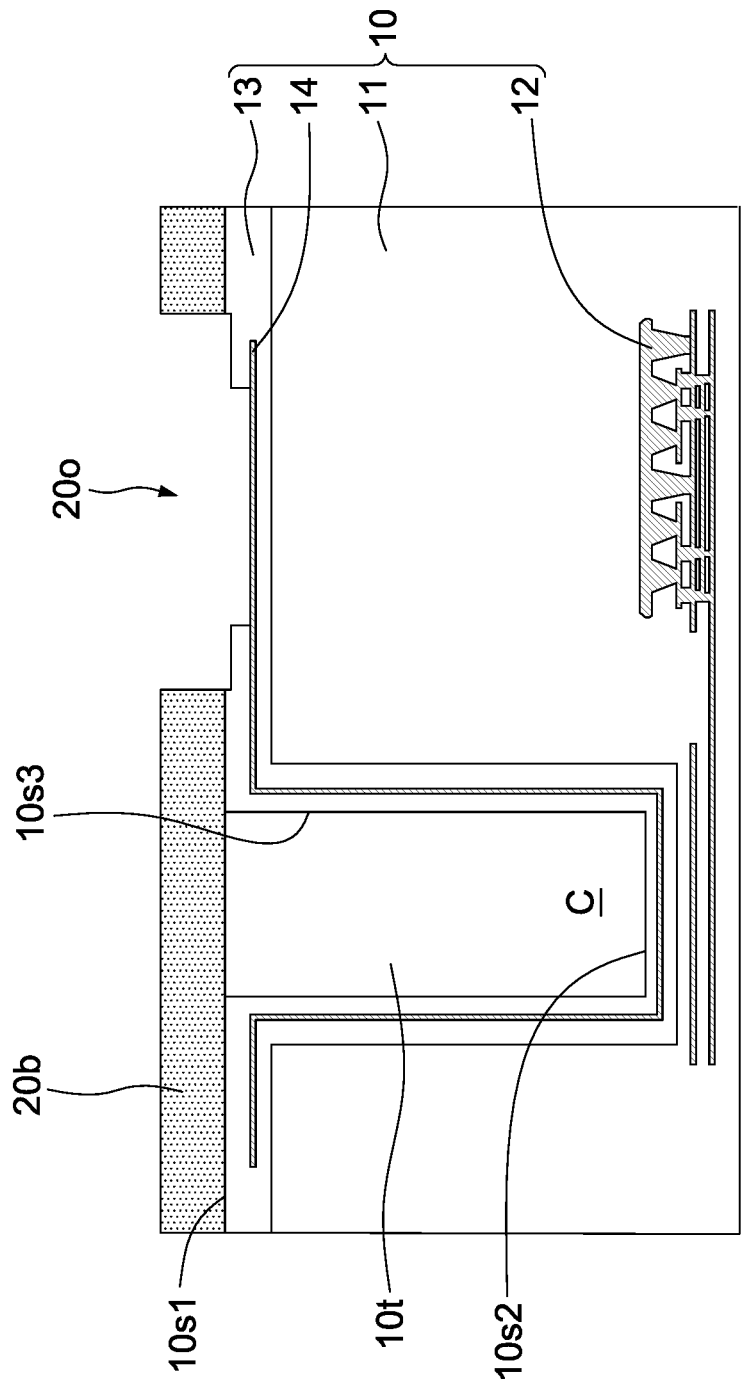
FIG. 6A, FIG. 6B, FIG. 6C, and FIG. 6D illustrate various stages of a method for manufacturing a semiconductor package structure in accordance with some embodiments of the present disclosure.

FIG. 6A, FIG. 6B, FIG. 6C, and FIG. 6D illustrate various stages of a method for manufacturing a semiconductor package structure in accordance with some embodiments of the present disclosure. The initial stage of the illustrated process prior to the stage of FIG. 6A is the same as, or similar to, the stage illustrated in FIG. 5A through FIG. 5B. FIG. 6A depicts a stage subsequent to that depicted in FIG. 5B.

Referring to FIG. 6A, the dielectric film 20' may be patterned to form the tenting structure 20b. The tenting structure 20b may cover the TSV 10t to define a cavity C. The tenting structure 20b may define an opening 20o for accommodating a conductive terminal. The opening 20o of the tenting structure 20b may not overlap the TSV 10t of the semiconductor structure 10. The dielectric structure 13 may be patterned such that a recess may be formed and the conductive trace 14 may be exposed from the surface 10s1 of the semiconductor structure 10.

Figure 6B:
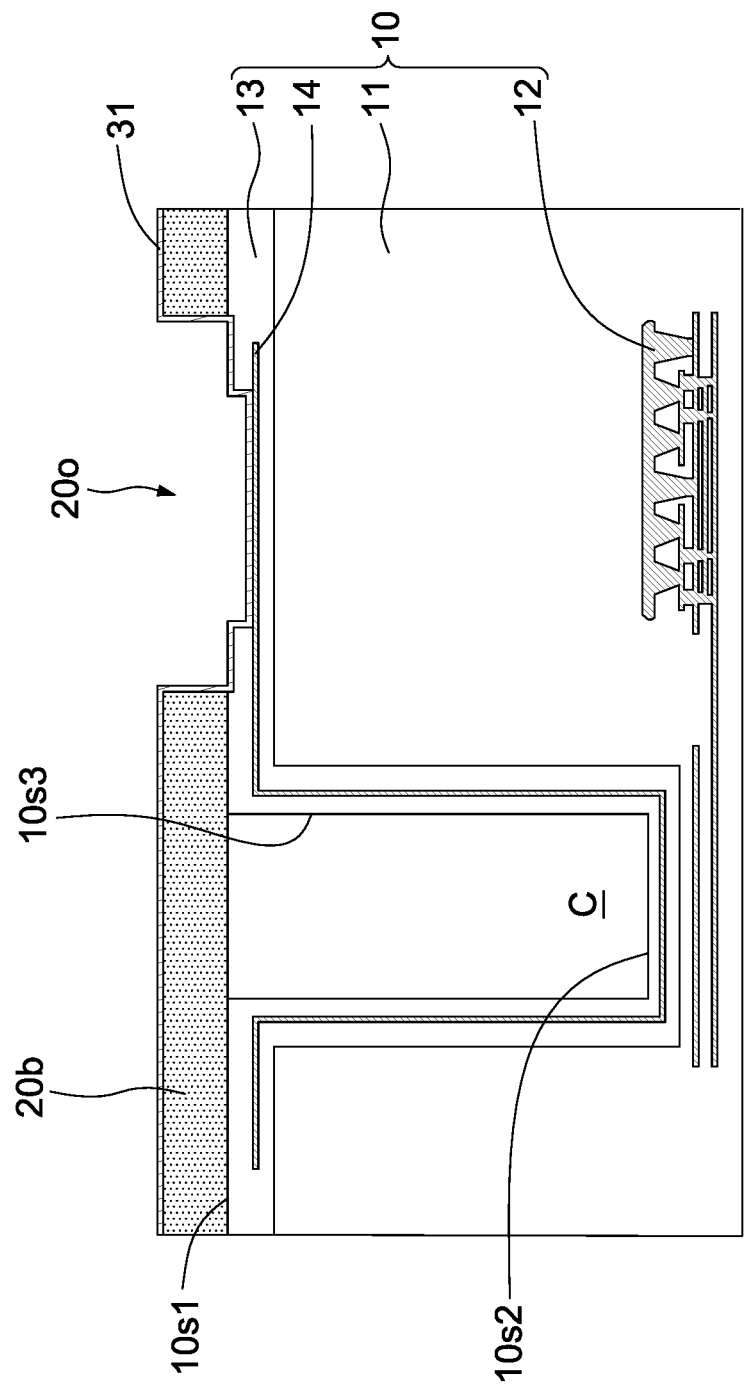

Referring to FIG. 6B, a layer 31 may be formed on the surface 10s1 of the semiconductor structure 10 and the tenting structure 20b. The layer 31 may be formed in the opening 20o and in contact with the conductive trace 14.

Figure 6C:
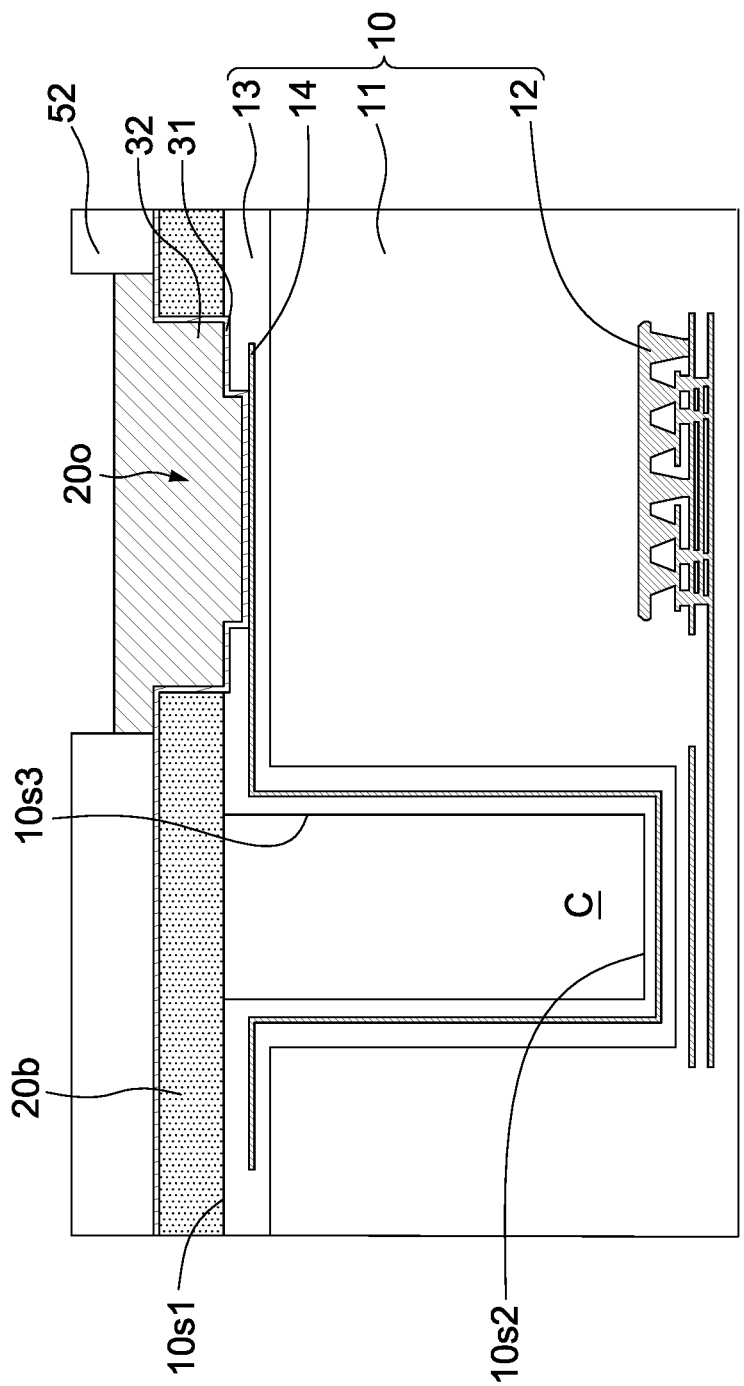

Referring to FIG. 6C, a photoresist layer 52 may be formed to cover the tenting structure 20b and the layer 31. The photoresist layer 52 may be patterned to define an opening aligning the opening 20o, and a layer 32 may be formed within the opening 20o of the tenting structure 20b.

Figure 6D:
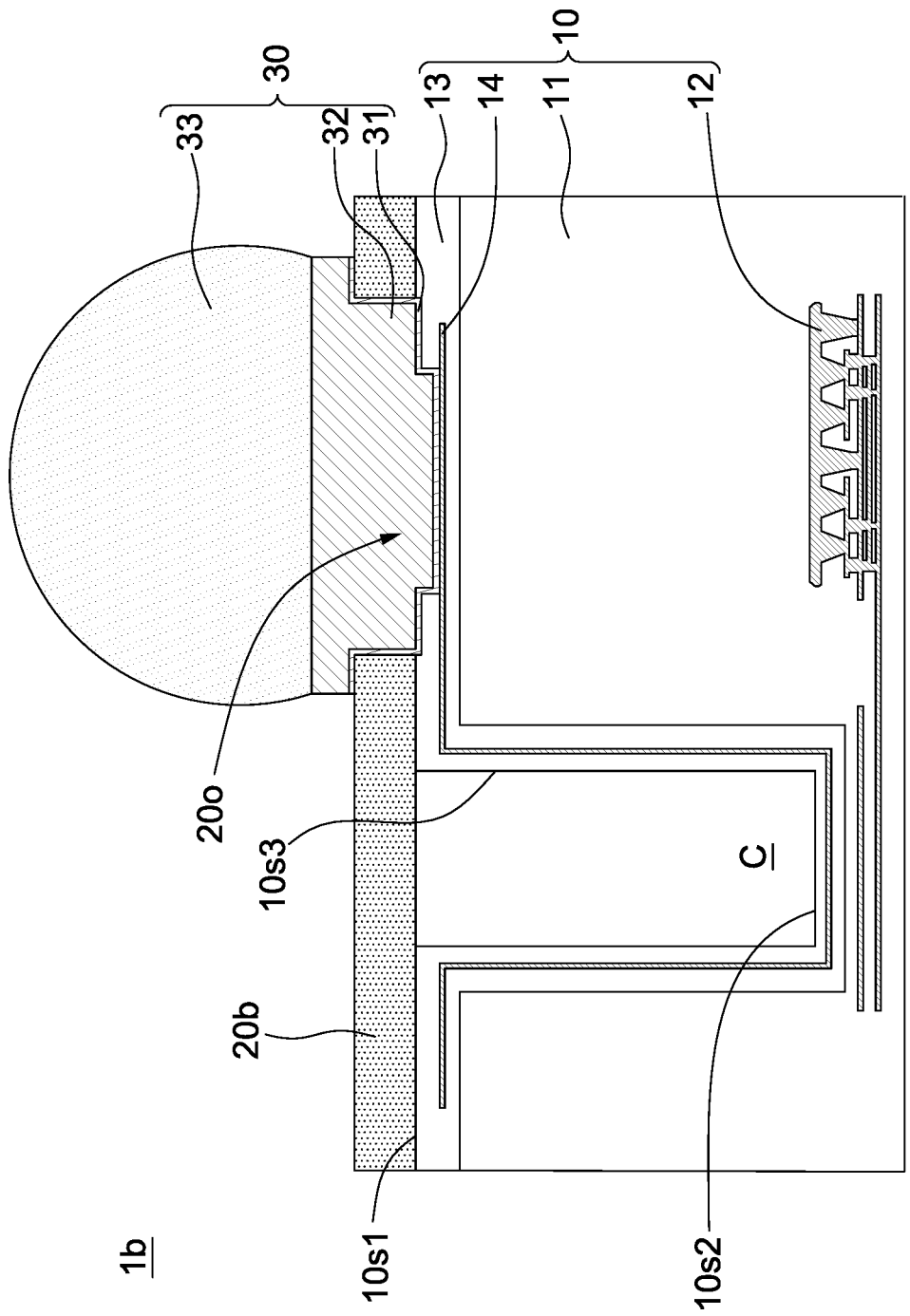

Referring to FIG. 6D, an electric connector 33 may be formed on the layer 32 to produce the conductive terminal 30 in the opening 20o of the tenting structure 20b. The photoresist layer 52 and the layer 31 underlying the photoresist layer 52 may be removed such that a semiconductor device structure the same as or similar to the semiconductor device structure 1b shown in FIG. 2A is produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
 a semiconductor structure having an inner lateral surface, a first top surface connected to the inner lateral surface and a cavity defined by the inner lateral surface and the first top surface
 and
 a tenting structure at least partially disposed over the inner lateral surface and the first top surface of the semiconductor structure,
 wherein the tenting structure has a bottom surface facing the first top surface of the semiconductor structure, and the bottom surface of the tenting structure has an arc-shaped profile, the semiconductor structure comprises a second top surface outside the cavity, and wherein a level of a first portion of the bottom surface of the tenting structure is higher than a level of the second top surface of the semiconductor structure, and a level of a second portion of the bottom surface of the tenting structure is lower than the level of the second top surface of the semiconductor structure.

2. The semiconductor package structure of claim 1, wherein the tenting structure comprises an inwardly-recessed area overlapping the first top surface of the semiconductor structure.

3. The semiconductor package structure of claim 1, wherein the tenting structure has a tip portion covering the inner lateral surface of the semiconductor structure.

4. The semiconductor package structure of claim 1, wherein the tenting structure has a first thickness corresponding to a center portion of the tenting structure and a second thickness corresponding to a lateral surface of the tenting structure, and the first thickness is less than the second thickness.

5. A method for manufacturing a semiconductor package structure, comprising:
   providing a semiconductor structure, the semiconductor structure having a first surface, a second surface and a third surface extending between the first surface and the second surface, and the first surface, the second surface and the third surface define a through-silicon via (TSV) recessed from the first surface, wherein the semiconductor structure comprises a conductive trace disposed adjacent to first surface, the second surface and the third surface of the semiconductor structure; and
   forming a tenting structure on the first surface of the semiconductor structure, wherein the tenting structure and the TSV define a cavity, and wherein forming the tenting structure further comprises:
      forming a dielectric film covering the TSV; and
      removing a portion of the dielectric material to form the tenting structure.

6. A method for manufacturing a semiconductor package structure, comprising:
   providing a semiconductor structure, the semiconductor structure having a first surface, a second surface and a third surface extending between the first surface and the second surface, and the first surface, the second surface and the third surface define a through-silicon via (TSV) recessed from the first surface, wherein the semiconductor structure comprises a conductive trace disposed adjacent to first surface, the second surface and the third surface of the semiconductor structure;
   forming a tenting structure on the first surface of the semiconductor structure, wherein the tenting structure and the TSV define a cavity; and
   performing a heat technique on the tenting structure so as to form a recess recessed from a bottom surface of the tenting structure.

7. The semiconductor package structure of claim 3, wherein the tip portion is located at a peripheral region of the cavity.

8. A semiconductor package structure, comprising:
   a semiconductor structure having an inner lateral surface, a first top surface connected to the inner lateral surface and a cavity defined by the inner lateral surface and the first top surface
   and
   a tenting structure at least partially disposed over the inner lateral surface and the first top surface of the semiconductor structure,
   wherein the tenting structure has a bottom surface facing the first top surface of the semiconductor structure, and the bottom surface of the tenting structure has an arc-shaped profile, and, wherein the semiconductor structure comprises a second top surface outside the cavity, and wherein the tenting structure has a first length in contact with the second top surface of the semiconductor structure and a second length in contact with the inner lateral surface of the semiconductor structure, and the first length is greater than the second length.

9. The semiconductor package structure of claim 1, wherein the tenting structure has an uneven thickness.

* * * * *